United States Patent [19]

Kitagawa et al.

[11] Patent Number: 4,585,671
[45] Date of Patent: Apr. 29, 1986

[54] FORMATION PROCESS OF AMORPHOUS SILICON FILM

[75] Inventors: Nobuhisa Kitagawa, Tokyo; Masataka Hirose, Hiroshima; Kazuyoshi Isogaya, Tokyo; Yoshinori Ashida, Higashi-Hiroshima, all of Japan

[73] Assignee: Mitsui Toatsu Chemicals, Incorporated, Tokyo, Japan

[21] Appl. No.: 629,843

[22] PCT Filed: Nov. 15, 1983

[86] PCT No.: PCT/JP83/00411

§ 371 Date: Jul. 6, 1984

§ 102(e) Date: Jul. 6, 1984

[87] PCT Pub. No.: WO84/02035

PCT Pub. Date: May 24, 1984

[30] Foreign Application Priority Data

Nov. 15, 1982 [JP] Japan ............... 57-199060

[51] Int. Cl.⁴ .............................. B05D 3/06
[52] U.S. Cl. .................... 427/54.1; 427/36; 427/53.1
[58] Field of Search ........... 204/157.1, 157.1 H; 427/53.1, 54.1, 35, 36

[56] References Cited

U.S. PATENT DOCUMENTS

| | | | |
|---|---|---|---|
| 3,490,961 | 1/1970 | Frieser et al. | 204/157.1 R |
| 4,348,428 | 9/1982 | Rockley et al. | 427/86 |
| 4,357,179 | 11/1982 | Adams et al. | 427/54.1 |
| 4,363,828 | 12/1982 | Brodsky et al. | 427/86 |
| 4,435,445 | 3/1984 | Allred et al. | 427/54.1 |
| 4,495,218 | 1/1985 | Azuma et al. | 427/54.1 |

OTHER PUBLICATIONS

"Novel Amorphous Silicon Solar Cells Prepared by Photochemical Vapor Deposition", Saitoh, et al. (Sep. 1982 at Tokyo) Proc. 14th Int. Conf. Solid State Devices.

Primary Examiner—Edward S. Williams
Attorney, Agent, or Firm—Fisher, Christen & Sabol

[57] ABSTRACT

A formation process of an amorphous silicon film, which process comprises subjecting a higher silane containing at least two silicon atoms to photochemical decomposition under radiation of a light having a wavelength of 300 nm or shorter so as to cause amorphous silicon to deposit on a substrate.

7 Claims, 1 Drawing Figure

FORMATION PROCESS OF AMORPHOUS SILICON FILM

TECHNICAL FIELD

This invention relates to a process for forming an amorphous silicon film (hereinafter abbreviated "a-Si film") by photochemical decomposition of a higher silane, and more specifically to a process for forming an a-Si film at a low temperature by conducting such decomposition of a higher silane under radiation of a light having a specific wavelength.

BACKGROUND ART owing to the excellent optoelectric characteristics of a-Si films, they are used in solar batteries, photosensors for electrophotography, thin-film transistors, optical sensors, etc. As one of fabrication processes of such a-Si films, may be mentioned the so-called chemical vapor deposition process (hereinafter abbreviated to "CVD") in which a gas such as silane is thermally decomposed to deposit amorphous silicon on a substrate. The CVD process has such great merits, compared with the plasma deposition technique, sputtering deposition technique, ion-plating process and the like, that the CVD process may be readily practiced without using complex, expensive and large facilities.

The CVD process is however accompanied by such drawbacks that the materials of substrates, on which a-Si is to be deposited, are limited to expensive metals, silica glass, sapphire or the like because the CVD process requires extremely high temperatures of 600° C. and higher. It is the so-called photochemical vapor deposition process that was proposed with a view toward solving such drawbacks and enabling to practice the CVD process at lower temperatures and has recently been attracting attention. Among such photo CVD processes, the leading one is currently the mercury sensitizing process. This process makes use of the sensitizing effect of mercury (Hg). When Hg vapor is also allowed to exist in a thermal decomposition reaction system and a light is radiated to Hg vapor to excite same

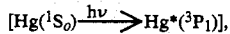

transfer of energy is induced to occur between the excited species and the reaction species so that the thermal decomposition reaction may be allowed to proceed. This action of Hg is a sort of catalytic effect and can increase the growth rate of the film by several to several thousands times. Accordingly, an a-Si film can be formed at a relatively low temperature (for example, 400° C. or so) for example in a thermal decomposition reaction of SiH4.

The mercury sensitizing process involves an inherent problem from the viewpoints of pollution and safety aspects that it requires to use mercury, which is a toxic substance difficult to handle, and moreover to employ it in a vapor form, and it is accompanied by a drawback that it is indispensable to apply a surface treatment and post treatment to resulting a-Si although such treatments are difficult to conduct—(1). Besides, the mercury sensitizing process is accompanied by a serious shortcoming from the practical view point that, since Hg vapor is caused to exist all over the interior of the reactor cylinder, a-Si is allowed to deposit on a window or the like through which a light is introduced into the reactor cylinder and hence gradually deposit there, interferes the introduction of the light and lowers the growth rate rapidly in the course of each decomposition operation, resulting in unavoidable frequent interruption of the operation—(2). In addition, there is a possibility that Hg may be taken in the resulting a-Si film—(3).

DISCLOSURE OF THE INVENTION

An object of this invention is to provide a process which permits to form an a-Si film by the photochemical decomposition of silane without need for any Hg catalyst.

Another object of this invention is to provide a process which enables to form an a-Si film even at a low temperature of 300° C. or lower, that is the thermal decomposition temperature of a higher silane.

The present invention provides the following formation process of an a-Si film:

A process for forming an amorphous silicon film, which process comprises subjecting a gaseous higher silane represented by the following general formula:

$$Si_nH_{2n+2}$$

wherein n stands for an integer of 2 or greater to photochemical decomposition under radiation of a light having a wavelength of 300 nm or shorter so as to cause amorphous silicon to deposit on a substrate.

BRIEF DESCRIPTION OF THE DRAWING

The FIGURE is a simplified schematic illustration of an apparatus useful in the practice of this invention.

BEST MODE FOR CARRYING OUT THE INVENTION

Figure 1:
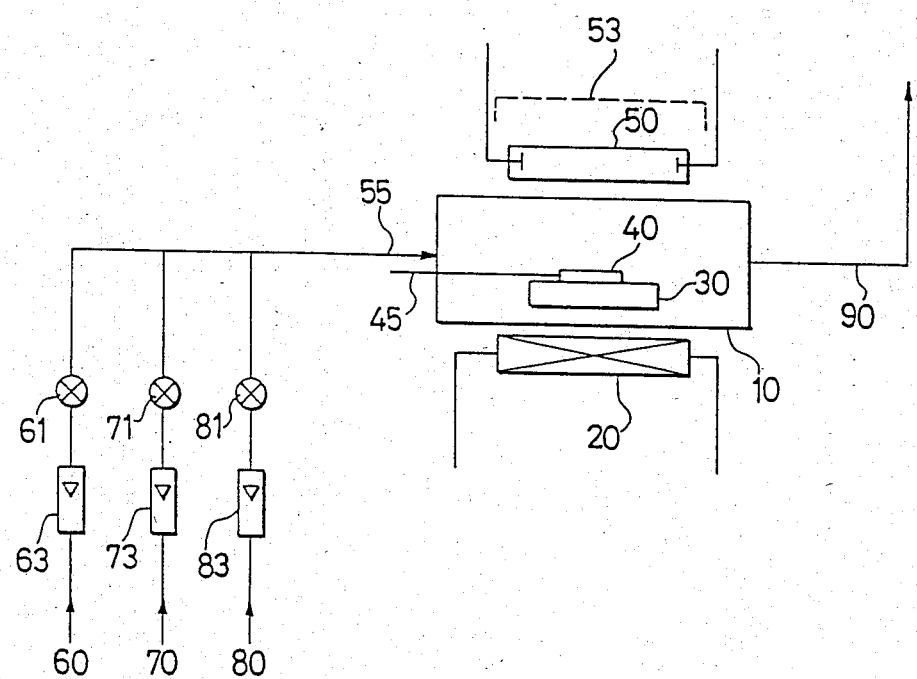

In the present invention, disilane or a still higher silane is employed in place of monosilane which has been commonly used. The number of silicon atoms in such a higher silane may preferably range from 2 to 6. Particularly preferred ones among such higher silanes may include disilane, trisilane and tetrasilane as they are easy to handle. They may be used either singly or in combination. These higher silanes may contain some still higher silanes without developing any substantial problem or inconvenience. Needless to say, a small amount of monosilane (SiH4) may also be present when using such a higher silane. If monosilane should be used solely in lieu of such a higher silane, it will be impossible to achieve the objects of this invention as described above.

The present invention forms an a-Si film on a substrate in accordance with the photochemical decomposition process known per se in the art, using such a higher silane as a raw material. Here, it is essential that the decomposition be carried out under radiation of a light having a wavelength of 300 nm or shorter.

Any light may be used in the practice of this invention so long as its wavelength is 300 nm or shorter. Besides ultraviolet ray, it is also possible to use lights or rays fallen in a shorter wavelength range, such as X-ray, γ-ray, etc. From the viewpoints of actual applicability and readiness in handling, it is however preferred to use ultraviolet rays, especially ultraviolet ray having a wavelength of 200-300 nm and far-ultraviolet ray having a wavelength of 200 nm or shorter.

As a light source for the above-mentioned ultraviolet rays, a metal vapor discharge tube, gas discharge tube or the like may be employed. As examples of the former tube, may be mentioned discharge tubes making use of sodium, potassium, rubidium, cesium, zinc, cadmium, thallium, mercury, etc., as examples of the latter one, hydrogen, herium, neon, argon, krypton, xenon, mercury, etc. A low-pressure mercury lamp, hydrogen discharge tube, xenon discharge tube and the like are particularly preferred. Besides, an ultraviolet laser beam may also be employed.

Where the wavelength of a radiation light should be in excess of 300 nm, it will be impossible to allow the photochemical decomposition of a higher silane to proceed to a sufficient extent and thus to achieve the objects of this invention.

The effect of light to increase the growth rate of an a-Si film becomes greater as the discharge tube has a greater output to a certain extent. However, an unduly great output develops some safety problems such as the simultaneous induction of a reaction in which $O_2$ present in the surrounding air is converted to ozone. Generally speaking, an output in the range of 10 W–10 KW, or preferably 100 W–1 KW is sufficient. By the way, the preferable light intensity may range from 0.1 mW/cm$^2$ to 100 mW/cm$^2$.

As the decomposition pressure in the present invention, any pressure may be used such as reduced atmospheric, atmospheric and elevated pressures. It is convenient to carry out the decomposition at a pressure of atmospheric pressure or higher because such a pressure leads inherently to a high film growth rate. In this case, the objects of this invention can be satisfactorily attained with a pressure in the range of 2 kg/cm$^2$-G and less. Needless to say, no problem or inconvenience would be encountered even if the decomposition is carried out at an elevated pressure higher than the above range.

Furthermore, the decomposition temperature (film-forming temperature) may be within the range of room temperature to 500° C., or preferably 100°–300° C. in the present invention. If the decomposition temperature should be lower than room temperature, the film growth rate will be very slow. On the other hand, any high temperatures exceeding 500° C. will impair the introduction of hydrogen into each a-Si film, thereby failing to obtain satisfactory characteristics.

As described above, the present invention provides an a-Si film by subjecting a gaseous higher silane to thermal decomposition under radiation of a light having a specific wavelength. Upon conducting such decomposition, it is of course feasible to incorporate, in the gaseous higher silane, (i) one or more of P-, As- and B-dopants such as $PH_3$, $AsH_3$, $B_2H_6$ and the like; (ii) one or more N-containing compounds such as $NH_3$, $N_2H_4$, etc.; (iii) one or more O-containing compounds such as $N_2O$, $O_2$, $SiH_3OSiH_3$ and so on; (iv) one or more compounds of Group IV elements such as $CH_4$, $SnH_4$, $GeH_4$ and the like; (v) one or more F-containing compounds such as $F_2$, $SiF_4$, $CF_4$ and the like; and/or like dopants. By incorporating such dopants, it is possible to form a-Si films having physical and chemical properties which conform with their application purposes. Accordingly, the application range of this invention can be expanded further.

As an apparatus for practicing the present invention, it is for example possible to use such an apparatus as depicted in the FIGURE. In the FIGURE, numeral 10 indicates a decomposition furnace (reactor tube) which is formed of a tube made of silica glass and having such dimensions as 30 mm in diameter and 500 mm in length to 60 mm in diameter and 1000 mm in length or so. The decomposition furnace may also be formed into rectangular configurations (duct) instead of tubular configurations. The reactor tube is equipped, adjacent to its outer circumference, with a heater 20 such as a halogen lamp. A decomposition zone is present in the reactor tube at a position confronting the heater, where there are placed a silicon susceptor 30 and a substrate 40, such as silica glass, silicon, sapphire, stainless steel or the like, mounted on the susceptor. The temperature of the substrate is measured by a thermocouple 45. Adjacent to the outer circumference of the reactor tube, a discharge tube 50 such as mercury lamp is provided so that an ultraviolet ray having a specific wavelength can be radiated, especially, to the decomposition zone and substrate. The radiation light is allowed to enter the reactor tube for radiation through the wall of the reactor tube which is made of silica glass having a high transmittance for ultraviolet rays or through a window (not shown) made of silica glass and formed in the wall.

Instead of introducing an ultraviolet ray by such a direct radiation method as described above, the introduction of an ultraviolet ray may also be carried out by providing, in the reactor tube, an ultraviolet ray reflector (not shown) having a high reflectivity and formed of a polished or evaporated aluminum and then introducing an ultraviolet ray from an ultraviolet lamp indirectly to the decomposition zone by way of the reflector.

Besides, an ultraviolet ray reflector 53 formed of such an aluminum surface may be provided behind the discharge tube 50 so as to improve the efficiency of radiation.

The discharge tube useful in the practice of this invention may be of any type and may take vertical, horizontal, U-shaped, spiral or other configurations. Where a mercury lamp is used as the discharge lamp, the mercury lamp may be suitably chosen from various mercury lamps in accordance with particular requirements and may for example be a low-pressure mercury lamp, high-output, low-pressure mercury lamp, or the like. It is also feasible to provide, as the discharge tube 50, a plurality of discharge tubes along the outer circumference of the reactor tube.

One end portion of the reactor tube serves as a feeding port 55 for the feed gas and is hence connected to the feed lines of a higher silane gas 60 and carrier gas 70. Where a dopant gas 80 such as $PH_3$, $B_2H_6$ or the like is used, its feed line may be provided as shown in the drawing. Numerals 61, 71, 81 indicate valves, while numerals 63, 73, 83 designate gas flow meters. The other end portion of the reactor tube forms a discharge port 90 through which the resulting gaseous reaction mixture is withdrawn.

Needless to say, the heater 20 may be of the resistance heating type capable of heating the reactor tube in its entirety, instead of the lamp heater.

Decomposition operation will next be described. The decomposition furnace is heated to a temperature above the decomposition temperature and nitrogen gas is then caused to flow through the decomposition furnace so as to conduct a baking operation. Then, the decomposition furnace is cooled down to the decomposition temperature and its temperature is stably maintained at 300°–500° C. Thereafter, a higher silane, which may be pure or may have been diluted to a concentration of 0.1–20% or so with an inert gas such as nitrogen, helium, argon, hydrogen or the like, as well as ammonia (derivative) and other gases are fed, with or without a carrier gas such as the aforementioned inert gas, to the decomposition furnace which has been kept at a temperature in the range of from room temperature to 500° C., or preferably at the decomposition temperature of 100°–300° C. An ultraviolet ray having a wavelength of 300 nm or shorter is introduced into the decomposition furnace, whereby carrying out the decomposition of the higher silane gas and causing an a-Si film to deposit on the substrate while radiating the decomposition zone and its vicinity areas.

The present invention will hereinafter be more specifically described by the following Examples. The a-Si films obtained in the following Examples were analyzed or evaluated in the following manner.

(1) Film thickness:

The film thicknesses were determined by using the weight method, the method relying upon a surface roughness meter and the method making use of interference by transmittance in combination, depending on the degrees of film thicknesses. Film growth rates (Å/min.) were calculated on the basis of the thus-determined film thicknesses and their corresponding decomposition time periods.

(2) Dark conductivity and photoconductivity:

Prior to measurement, a gate electrode was evaporated by the vacuum deposition technique on each test a-Si film to determine its ohmic characteristic. Its voltage-current characteristic was measured by means of a diffraction grating spectrometer, CT-50 (manufactured by Nippon Bunko Kabushiki Kaisha). The term "dark conductivity" means a conductivity of a sample when light was shut off. On the other hand, the term "photoconductivity" means a conductivity of a sample when a light of 2 eV, which contained $3 \times 10^{14}$ photons, were radiated vertically onto the sample.

EXAMPLE 1

The apparatus shown in the FIGURE was used as an apparatus for the experiment. Namely, the reactor tube was a quartz tube of 40 mm across and 600 mm long. Adjacent to the outer circumference of the reactor tube, there was provided a single piece of tubular low-pressure mercury lamp (500 W) manufactured by Sen Tokushu Kogen Kabushiki Kaisha (an ultraviolet ray of a wavelength of 254 nm amounts to 60% of all the radiant ultraviolet rays and an ultraviolet ray having a wavelength of 185 nm accounts for 30% of all the radiant ultraviolet rays). A feed gas containing 10% of $Si_2H_6$ and diluted with $H_2$ gas was supplied at a flow velocity of 500 cc/min., while feeding $N_2$ gas as a carrier gas at a flow velocity of 2 liters/min., both at a pressure of 0.5 kg/cm²-G. Thus, the decomposition and deposition were conducted at 100° C. for 30 minutes while radiating the ultraviolet ray at an illuminance of 10 mW/cm². Results are shown in Table 1.

EXAMPLES 2–4

An experiment was conducted in the same manner as in Example 1 except that the decomposition temperature and the raw material, higher silane were changed. Results are given in Table 1.

COMPARATIVE EXAMPLES 1–7

Tests, which were similar to the Examples, were carried out under the conditions given in Table 2. Results are also summarized in Table 2.

TABLE 1

| | (Examples) | | | | | | | | | | |
|---|---|---|---|---|---|---|---|---|---|---|---|
| | Feed gas | | | Carrier gas | | Decomposition conditions | | | | a-Si film Growth rate (Å/min.) | Characteristics of a-Si film | |
| Ex. No. | Silane gas | Diluting gas | Flow velocity (cc/min.) | Flow velocity (l/min.) | Temp. (°C.) | Pressure (kg/cm²-G) | U.V. radiation | Mercury sensitization | | Dark conductivity ($\Omega^{-1}cm^{-1}$) | Photo-conductivity ($\Omega^{-1}cm^{-1}$) |
| 1 | $Si_2H_6$ | He | 500 | $N_2$ 2 | 100 | 0.5 | Radiated | Not applied | 170 | $1 \times 10^{-6}$ | $4 \times 10^{-4}$ |
| 2 | $Si_2H_6$ | He | 500 | $N_2$ 2 | 200 | 0.5 | Radiated | Not applied | 220 | $2 \times 10^{-7}$ | $1 \times 10^{-5}$ |
| 3 | $Si_2H_6$ | He | 500 | $N_2$ 2 | 300 | 0.5 | Radiated | Not applied | 250 | $5 \times 10^{-10}$ | $3 \times 10^{-6}$ |
| 4 | $Si_3H_8$ | He | 500 | $N_2$ 2 | 100 | 0.5 | Radiated | Not applied | 230 | $7 \times 10^{-6}$ | $5 \times 10^{-4}$ |

TABLE 2

| | (Comparative Examples) | | | | | | | | |
|---|---|---|---|---|---|---|---|---|---|
| | Feed gas | | | Carrier gas | | Decomposition conditions | | | a-Si film Growth rate (Å/min.) |
| Ex. No. | Silane gas | Diluting gas | Flow velocity (cc/min.) | Flow velocity (l/min.) | Temp. (°C.) | Pressure (kg/cm²-G) | U.V. radiation | Mercury Sensitization | |
| 1 | $Si_2H_6$ | He | 500 | $N_2$ 2 | 300 | 0.5 | Not radiated | Not applied | 3 |
| 2 | $Si_2H_6$ | He | 500 | $N_2$ 2 | 200 | 0.5 | Not radiated | Not applied | 0 |
| 3 | $Si_2H_6$ | He | 500 | $N_2$ 2 | 100 | 0.5 | Not radiated | Not applied | 0 |
| 4 | $Si_3H_8$ | He | 500 | $N_2$ 2 | 100 | 0.5 | Not radiated | Not applied | 0 |
| 5 | $SiH_4$ | He | 500 | $N_2$ 2 | 300 | 0.5 | Radiated | Not applied | 0.1 |
| 6 | $Si_2H_6$ | He | 500 | $N_2$ 2 | 100 | 0.5 | Radiated | Applied | * |
| 7 | $Si_2H_6$ | He | 500 | $N_2$ 2 | 100 | 0.5 | Radiated** | Not applied | 0 |

*A film was formed only for the first 5 minutes. Thereafter, the deposition of a-Si on the wall of the reactor tube became excessive, leading to complete prevention of ultraviolet ray introduction.
**A high-pressure mercury lamp capable of radiating near-ultraviolet rays centered at 365 nm was employed.

According to the process of this invention, amorphous silicon films can be formed at far lower temperatures than those required in the conventional CVD process, without need for any toxic substances such as mercury catalyst.

INDUSTRIAL UTILITY

Films obtained in accordance with this invention can be suitably used in such application fields as solar batteries, photosensors for electrophotography, thin-film transistors, optical sensors and the like.

We claim:

1. A process for forming an amorphous silicon film, which process comprises subjecting a gaseous higher silane represented by the following general formula $$Si_nH_{2n+2}$$

wherein n stands for an integer of 2 or greater to photochemical decomposition under radiation of light having a wavelength of 300 nm or shorter, at a temperature of 100° to 300° C. and at a pressure of atmospheric pressure or higher so as to cause amorphous silicon to deposit on a substrate.

2. The process according to claim 1, wherein the higher silane contains 2 to 6 silicon atoms.

3. The process according to claim 1, wherein the higher silane is disilane, trisilane or tetrasilane.

4. The process according to claim 1, wherein the pressure is less than 2 kg/cm²-G.

5. The process according to claim 1, wherein the decomposition is carried out under radiation of an ultraviolet ray having a wavelength of 200 to 300 nm.

6. The process according to claim 1, wherein the decomposition is carried out under radiation of a far-ultraviolet ray having a wavelength of 200 nm or shorter.

7. The process according to claim 1 wherein the decomposition is carried out in the absence of mercury vapor.

* * * * *